United States Patent [19]
Aimoto et al.

[11] Patent Number: 5,463,591
[45] Date of Patent: Oct. 31, 1995

[54] DUAL PORT MEMORY HAVING A PLURALITY OF MEMORY CELL ARRAYS FOR A HIGH-SPEED OPERATION

[75] Inventors: Yoshiharu Aimoto; Tadahiko Sugibayashi, both of Tokyo, Japan

[73] Assignee: NEC Corporation, Tokyo, Japan

[21] Appl. No.: 225,450

[22] Filed: Apr. 6, 1994

[30] Foreign Application Priority Data

Apr. 6, 1993 [JP] Japan ............................. 5-078433

[51] Int. Cl.$^6$ .................................................. G11C 8/00
[52] U.S. Cl. ............................. 365/230.05; 365/189.12; 365/240; 365/230.09
[58] Field of Search .................. 365/230.05, 230.09, 365/221, 239, 240, 189.12, 230.03

[56] References Cited

U.S. PATENT DOCUMENTS 5,249,165  9/1993  Toda .................................... 365/230.05
5,260,905  11/1993  Mori ......................................... 365/240

OTHER PUBLICATIONS

S. Ishimoto et al., "A 256K Dual Port Memory", 1985 IEEE International Solid–State Circuits Conference, Digest of Technical Papers, pp. 38–39.

Primary Examiner—David C. Nelms
Assistant Examiner—Vu A. Le
Attorney, Agent, or Firm—sughrue, Mion, Zinn, Macpeak & Seas

[57] ABSTRACT

A dual port memory has a plurality of memory cell arrays. Plural bit lines for one word are divided into k groups each including m bit lines, and k data busses are commonly provided for all of the memory cell arrays. Bit selecting circuits control data transfer between the data busses and the memory cell arrays. A shift register circuit includes a plurality of partial shift registers which are serially connected with each other and each of which includes serially connected registers corresponding to the data busses. The shift register circuit carries out parallel data transfer between the data busses and each of the partial shift registers, and serial data transfer between one of the partial shift registers and an outside circuit. A dual port memory is provided in which the number of circuit elements and the surface size of memory chips can be reduced while maintaining a high speed of operation.

7 Claims, 5 Drawing Sheets

DUAL PORT MEMORY HAVING A PLURALITY OF MEMORY CELL ARRAYS FOR A HIGH-SPEED OPERATION

BACKGROUND OF THE INVENTION (a) Field of the Invention

The present invention relates to a dual port memory, and more particularly, to a dual port memory having a large capacity and provided with a random access port and a serial access port.

(b) Description of Related Art

As the capacity of a memory increases, the number of memory cells connected to each bit line or each word line increases, which in turn increases the parasitic capacitances of the bit lines and the word lines. The increase of the parasitic capacitances deteriorates a high speed operation of the memory. To overcome this problem, technology has been developed to reduce the parasitic capacitances of the bit lines and word lines by dividing the array of memory cells into plural arrays so that a high operational speed of the memory can be obtained.

FIG. 1 shows a conventional dual port memory comprising a random access port and a serial port in a block diagram. The dual port memory, which operates in a RAM cycle or in a transfer cycle, includes n memory cell arrays 11-1n, n word line selecting circuits 21-2n, n sense amplifier circuits 31-3n, n data registers 81-8n, n data transfer circuits 71-7n, n shift registers 91-9n, and a single selector circuit 10.

Each of the n memory cell arrays 11-1n (n=4, for example) is provided with plural word lines, plural bit lines intersecting the plural word lines while being insulated therefrom, and plural memory cells provided at intersections between the bit lines and word lines. When one of the word lines is actuated or caused to have a voltage of a selection level, data stored in corresponding memory cells are output to the bit lines, or data on the bit lines are stored in the memory cells.

Each of the word line selecting circuits 21-2n operates to cause one of the word lines of the corresponding memory cell array to have the selection level in accordance with the address signals ADw1-ADwn. Each of the sense amplifier circuits 31-3n includes plural sense amplifiers SA which are provided For the respective bit lines of a corresponding one of the memory cell arrays 11-1n so as to amplify signals on the bit lines.

Each of the data registers 81-8n includes plural registers corresponding to bit lines of a corresponding one of the memory cell arrays 11-1n. The data registers 81-8n operate to read serial bit data from outside in accordance with register control signals and store the data in the registers, and operate to serially output data held in the registers to the outside in accordance with the register control signals.

The data transfer circuits 71-7n operate in accordance with data transfer signals TG1-TGn to effect data transfer between the bit lines of the memory cell arrays 11-1n and respective registers in the data registers 81-8n via the sense amplifier circuits 31-3n. The shift registers 91-9n operate in response to clock signals CK1-CKn to generate the register control signals supplied to the respective data registers 81-8n. The selector circuit 10 selects one of the data registers 81-8n in accordance with the address signals ADm, and effects data transfer between the selected data register and an outside circuit.

Assuming that the whole capacity of a dual port memory is 512 bits×1024 words, and is established by a single memory cell array, then 1,024 memory cells are connected to each bit line. This increases the length of each bit line and the parasitic capacitance of each bit line. However, in a dual port memory divided into n memory cell arrays, for example into four arrays, as described above, the number of memory cells connected to each bit line is equal to 1024/n. Thus, in the case of a memory having four divided arrays, the number of memory cells connected each bit line is 1024/4=256. Accordingly, the parasitic capacitance of each bit line is also reduced to one-n'th. Hence, when there are four divided arrays, the parasitic capacitance is one-fourth. This allows the dual port memory to operate at a higher speed.

Moreover, the above-mentioned dual port memory has an advantage in that during the time when data is output From one of the n memory cell arrays to an outside circuit through a serial access port, data transfer between another memory cell array and a corresponding data register can be effected. This makes it possible to carry out data output without waiting for the completion of data transfer, which also attributes to a higher operational speed.

FIG. 2 shows in greater detail a circuit portion of the dual port memory of FIG. 1. The dual port memory comprises the following circuit elements for each of the memory cell arrays 11-1n. Namely, each data transfer circuit 7j comprises transistors Q71, Q72, . . . equal in number to the bit lines, i.e., the number of bits composing each word of data (in the above mentioned-case, the number is 512). Each data register 8j comprises registers DR1, DR2, . . . and transistors Q81, Q82, . . . both equal in number to the bit lines, and each shift register 9j comprises registers R1, R2, . . . equal in number to the bit lines. In the case where each word data is composed of, 512 bits and the number n of the arrays is equal to 4, the total number of transistors is 512×4×2, while the total number of registers is also 512×4×2.

Since the conventional dual port memory as described above has a plurality of divided memory cell arrays, both the length of each bit line and the number of memory cells connected to each bit line can be reduced. Furthermore, during the time when data is output From one of the n memory cell arrays to an outside circuit, data transfer between another memory cell array and a corresponding data register can be effected. These features allow the memory to operate at a high speed.

The conventional dual port memory, however, has a drawback that a data transfer circuit, a data register and a shift register are provided for each of the memory cell arrays, which results in an increased number of circuit elements and an enlarged surface size of memory chips.

SUMMARY OF THE INVENTION

In view of the foregoing, it is an object of the present invention to provide a dual port memory in which the above-described problems are solved and in which the surface size of memory chips is reduced while maintaining a high speed of operation.

Briefly, the present invention provides an improved dual port memory which includes n memory cell arrays (wherein n is an integer not less than 2), k data busses (wherein k is an integer not less than 2), n bit selecting circuits, and a single shift register circuit.

Each of the memory cell arrays is provided with plural word lines, plural bit lines which intersect the plural word lines while insulated therefrom, and plural memory cells provided correspondingly to intersections between the bit lines and the word lines. When one of the word lines has a voltage of a selection level, data stored in corresponding memory cells are output to the bit lines, or data on the bit lines are stored in the memory cells.

In the present invention, plural bit lines for one-word data are divided to k groups each including m bit lines (wherein m is an integer not less than 2). The data busses correspond to the divided groups and are provided in common to the plural memory cell arrays. The bit selecting circuit is provided for each of the memory cell arrays. Each bit selecting circuit selects one of the m bit lines in each of the k divided groups of a corresponding memory cell array in accordance with corresponding bit selection signals thereby effecting data transfer between selected bit lines and the data busses.

The shift register circuit includes p serially connected partial shift registers each including k serially connected registers which respectively correspond to the k data busses. The partial shift registers operate in accordance with selection control signals and clock signals to receive serial bit data from outside and store the received data into the registers of the partial shift registers and sequentially transfer the data held in the registers of each partial shift register to the data busses. The partial shift registers also operate in accordance with the selection control signals and clock signals to sequentially transfer data on the data busses to the registers of each partial shift register and serially output the data stored in the registers of the partial shift registers to an outside circuit.

In the dual port memory according to the present invention, since data transfer between the memory cell arrays and the shift register circuit and serial data input and output from and to an outside circuit can be simultaneously carried out, there is an advantage that the dual port memory can be operated at a higher speed. Moreover, since a single shift register circuit can be commonly used for plural memory cell arrays, the number of circuit elements used in the memory can be drastically reduced, hence there is another advantage that the surface size of memory chips can be reduced.

BRIEF DESCRIPTION OF THE DRAWINGS

The above and other objects as well as features and advantages of the present invention will become more apparent from the following description, referring to the accompanying drawings in which.

DETAILED DESCRIPTION OF THE PREFERRED EMBODIMENT

Figure 1:
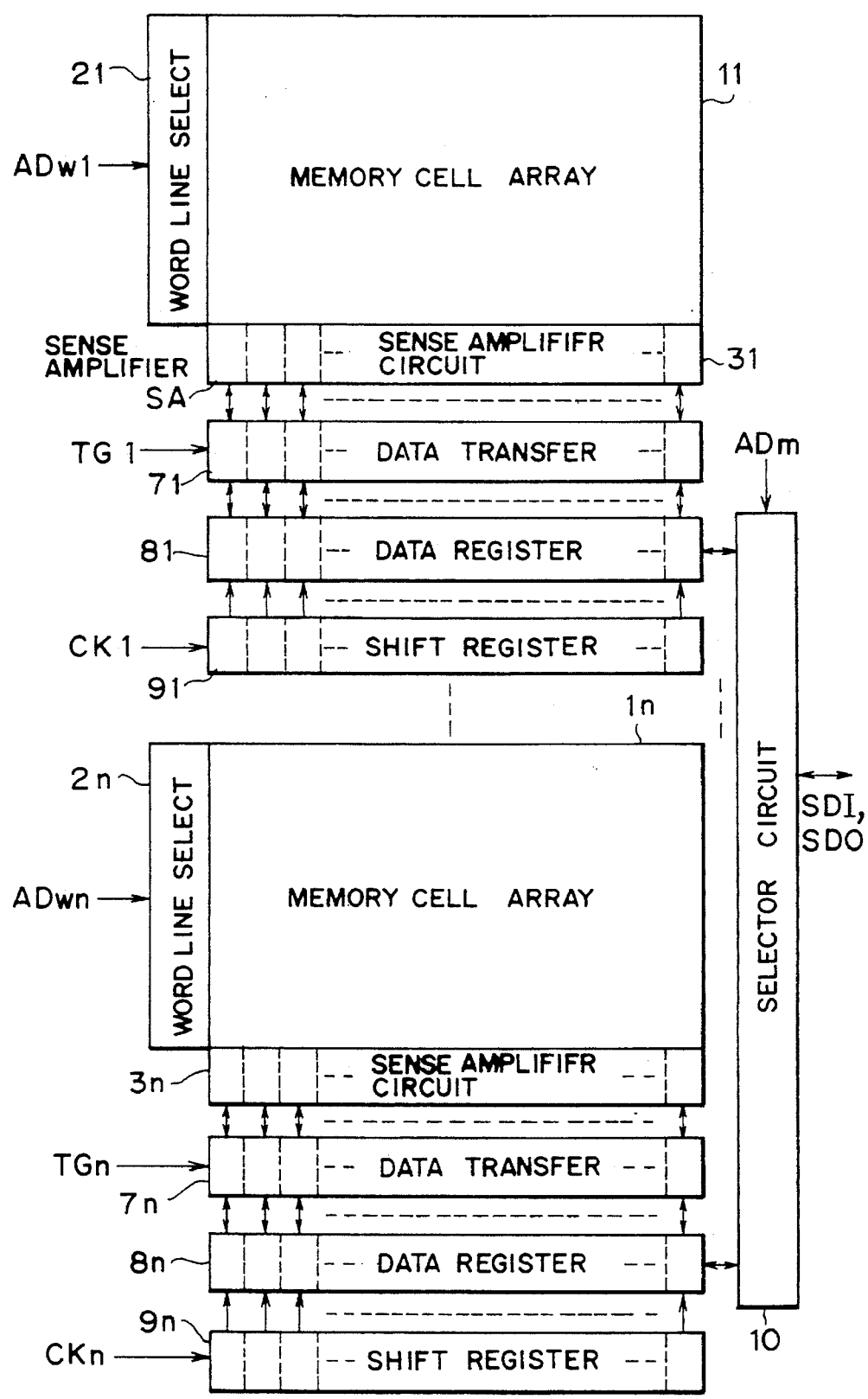
FIG. 1 is a block diagram showing a conventional dual port memory.
Figure 2:
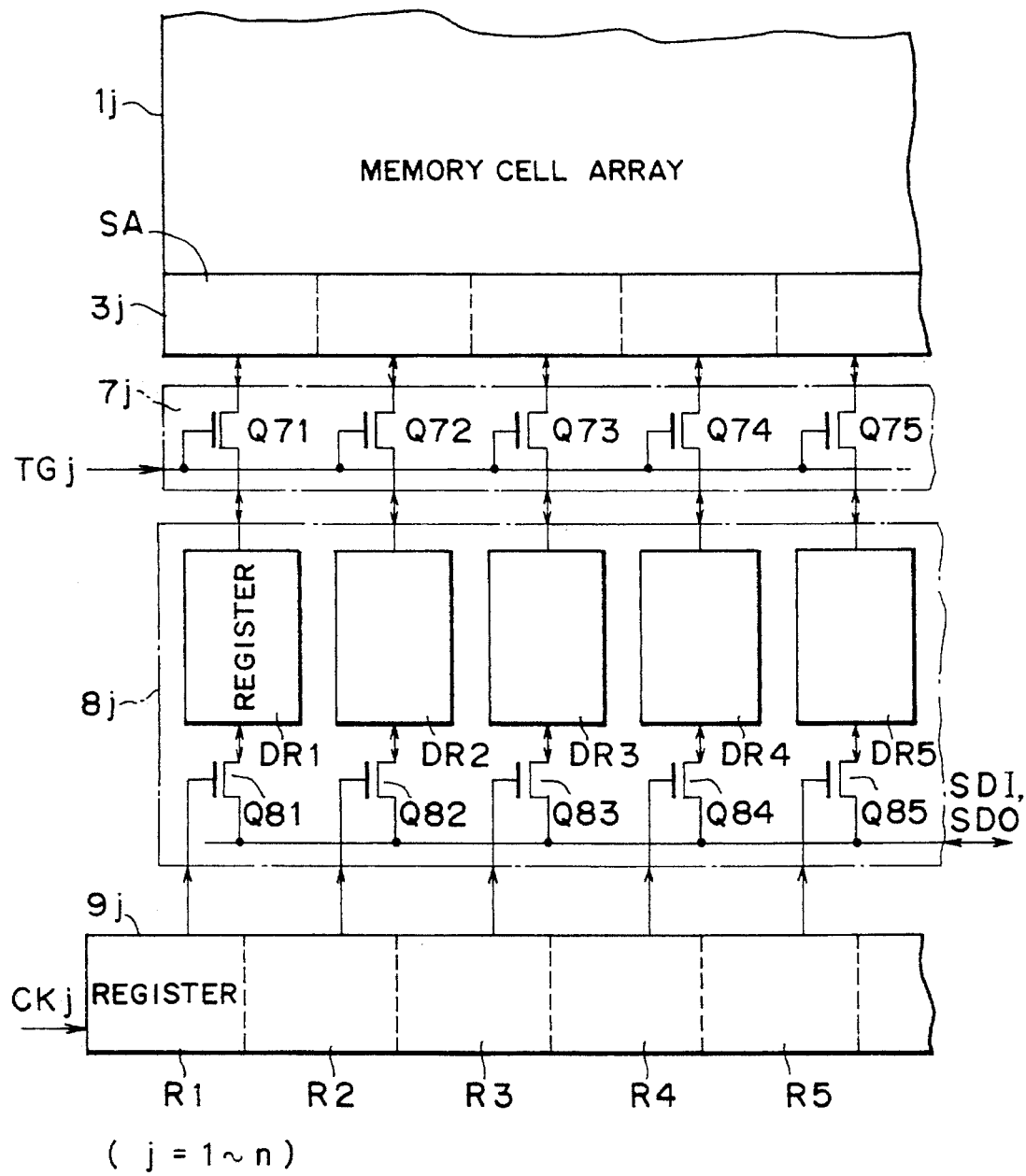
FIG. 2 is a circuit diagram showing in greater detail a circuit portion of the dual port memory shown in FIG. 1.
Figure 3:
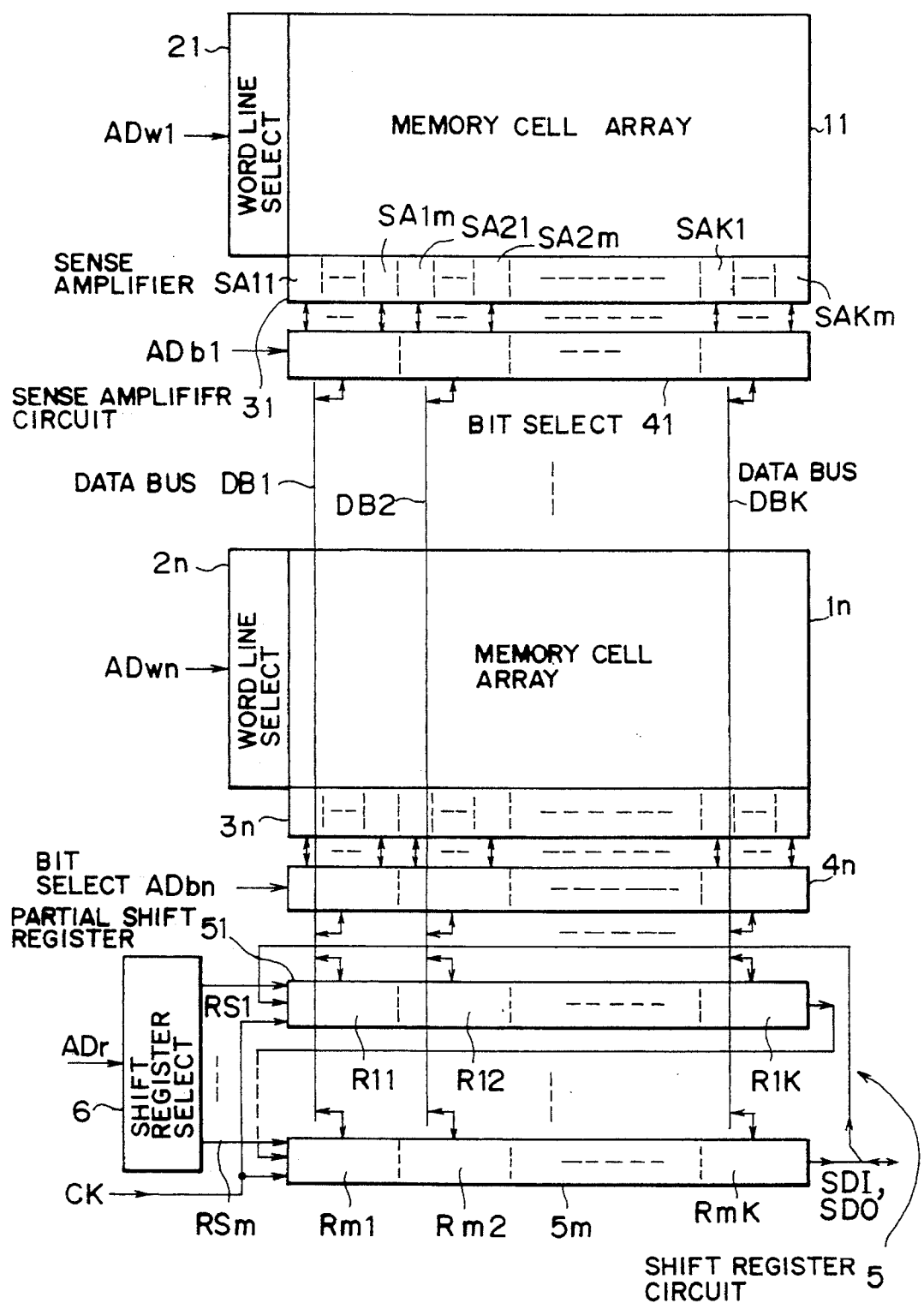
FIG. 3 is a block diagram showing a dual port memory according to a first embodiment of the present invention.

The present invention will now be described by means of preferred embodiments thereof. FIG. 3 is a block diagram showing a dual port memory according to the first embodiment of the present invention. The dual port memory is provided with n memory cell arrays 11-1n (wherein n is an integer not less than 2), n word line selecting circuits 21-2n, k data busses DB1-DBk (wherein k is an integer not less than 2), n bit selecting circuits 41-4n, a shift register circuit 5 including m partial shift registers 51-5m (wherein m is an integer not less than 2), and a shift register selection control circuit 6.

Each of the memory cell arrays 11-1n is provided with plural word lines (not illustrated), plural bit lines (not illustrated) which intersect the plural word lines while insulated therefrom, and plural memory cells (not illustrated) provided correspondingly to intersections between the bit lines and word lines, When one of the word lines has a voltage of selection level in a data transfer cycle, data stored in corresponding memory cells are output to the bit lines, or data on the bit lines are stored in the memory cells. Each of the word line selecting circuits 21-2n operates to cause a certain word line of the corresponding memory cell array to have the voltage of the selection level in accordance with the address signals ADw1-ADwn.

Plural bit lines in each of the memory cell arrays 11-1n for one-word data is divided into k groups each including m bit lines (wherein k and m are independently an integer not less than 2). The data busses DB1-DBk correspond to the divided groups of the bit lines and are commonly provided for all of the plural memory cell arrays 11-1n.

The bit selecting circuits 41-4n are provided for the memory cell arrays 11-1n. Each of the bit selecting circuits 41-4n selects one of the m bit lines in each of the k divided groups of a corresponding memory cell array in accordance with corresponding bit selection signals and effects data transfer between selected bit lines in the memory cell array and the data busses DB1-DBk.

The shift register circuit includes m serially connected partial shift registers 51-5m each including k serially connected individual registers R11-R1k, ... Rm1-Rmk which respectively correspond to the data busses DB1-DBk. The partial shift registers 51-5m operate in accordance with selection control signals RS1-RSm and clock signals CK to receive serial bit data from outside through a common serial access port and store the received data into the individual registers R11-R1k, ... Rm1-Rmk of the partial shift registers 51-5m and sequentially transfer the data held in the individual registers R11-R1k, ..., Rm1-Rmk of each of the partial shift registers 51-5m to the data busses DB1-DBk.

The partial shift registers 51-5m also operate in accordance with the selection control signals RS1-RSm and clock signals CK to sequentially transfer data on the data busses DB1-DBk to the registers R11-R1k, ..., Rm1-Rmk of each of the partial shift registers 51-5m, and serially output the data stored in the registers R11-R1k, ..., Rm1-Rmk of the partial shift registers 51-5m to an outside circuit. The shift register selection control circuit 6 generates the selection control signals RS1-RSm in accordance with address signals ADr used for selecting the partial shift registers 51-5m.

In operation, for writing serial bit data received from the outside to the memory cell arrays 11-1n, the serial bit data SDI received from outside is first input to the first register R11 of the first partial shift register 51, then successively shifted to the downstream registers R12, R13, ... in response to the selection control signals RS1-RSm output from the shift register selection control circuit 6. The data held in the last register R1k of the first partial shift register 51 is transferred to the first register of the second partial shift register 52 (not illustrated), then shifted to the successive individual registers. The data is successively shifted down to the last partial shift register 5m.

When the first received data bit arrives at the last register

Rmk of the last partial shift register 5m, it is judged that data for one word have already been stored in all of the partial shift registers 51-5m. Subsequently, all the data held ]n the last partial register 5m are transferred to the data busses DB1-DBk at a time. One of the bit selecting circuits 41-4n, for example 41, transfers the data on the data busses DB1-DBk to corresponding bit lines of the memory cell array 11 via sense amplifiers SA11, SA21, ... SAk1. When serial data for the next word is subsequently input from outside, the data held by the registers of the partial shift registers 51-5m are all shifted so that new data bit arrives at the last register Rmk.

When the last register Rmk of the last partial shift register 5m receives a new data bit, the data held in the partial shift register 5m are also transferred to the data busses DB1-DBk at a time, and the data on the data busses DB1-DBk are supplied to bit lines adjacent to the bit lines to which the data were supplied by the previous operation. By repeating the above-described operation, data for one word is stored in the memory cell array 11.

Data for the next word is then stored in one of the memory cell arrays, memory cell array 12, for example. By repeating the above-described operation, serial data for plural words are successively received and stored in the memory cell arrays 11-11n. Operation for shifting the data for the last word to be stored is stopped when the first bit of the data reaches the register Rmk. Subsequently, the data held in each of the partial shift registers 5m-51 is sequentially transferred to the data busses DB1-DBk, then stored in a predetermined memory cell array. With this operation, the amount of time required for data transfer after the last bit of the word is received can be shortened.

In order to read out data from the memory cell arrays, the dual port memory operates in reverse. For example, in the case where one word of data is to be read out from the memory cell array 11, the data stored in the memory cell array 11 is transferred portion by portion to the partial shift registers 5m-51 via the sense amplifiers SA11-SAk1, SA12-SAk2, ..., SA1m-SAkm and the data busses DB1-DBk. Subsequently, shift operation is started so that the data held in the partial shift registers 5m-51 is serially output from the register Rmk bit by bit.

When the shift register 51 becomes empty due to the shift operation, new word data is read out from, for example, memory cell array 12 (not illustrated) and is transmitted to the shift register 51 via the sense amplifiers SA11-SA1 and the data busses DB1-DBk. By repeating this operation, plural words of data are continuously read out from the memory cell arrays 11-1n and are serially output.

In the first embodiment as described above, although the number of sense amplifiers connected to each of the data busses DB1-DBk is the same as the number of partial shift registers, these numbers need not be the same. At least two partial shift registers are provided to simultaneously carry out data transfer between the memory cell arrays and the partial shift registers and data transfer between the partial shift registers and an outside circuit.

in the dual port memory according to the first embodiment, the memory cell array section is divided into a plurality of memory cell arrays, similar to the conventional dual port memory. In addition, data transfer between the memory cell arrays and the shift register circuit and serial data input and output from and to an outside circuit can simultaneously be carried out. Therefore, the dual port memory according to the present embodiment can operate at a high speed comparable to that of the conventional dual port memory. Moreover, a single shift register circuit can be used for all of n memory cell arrays, so that the number of circuit elements used in the memory can be drastically reduced. Hence, the surface size of memory chips can be made smaller.

Figure 4:
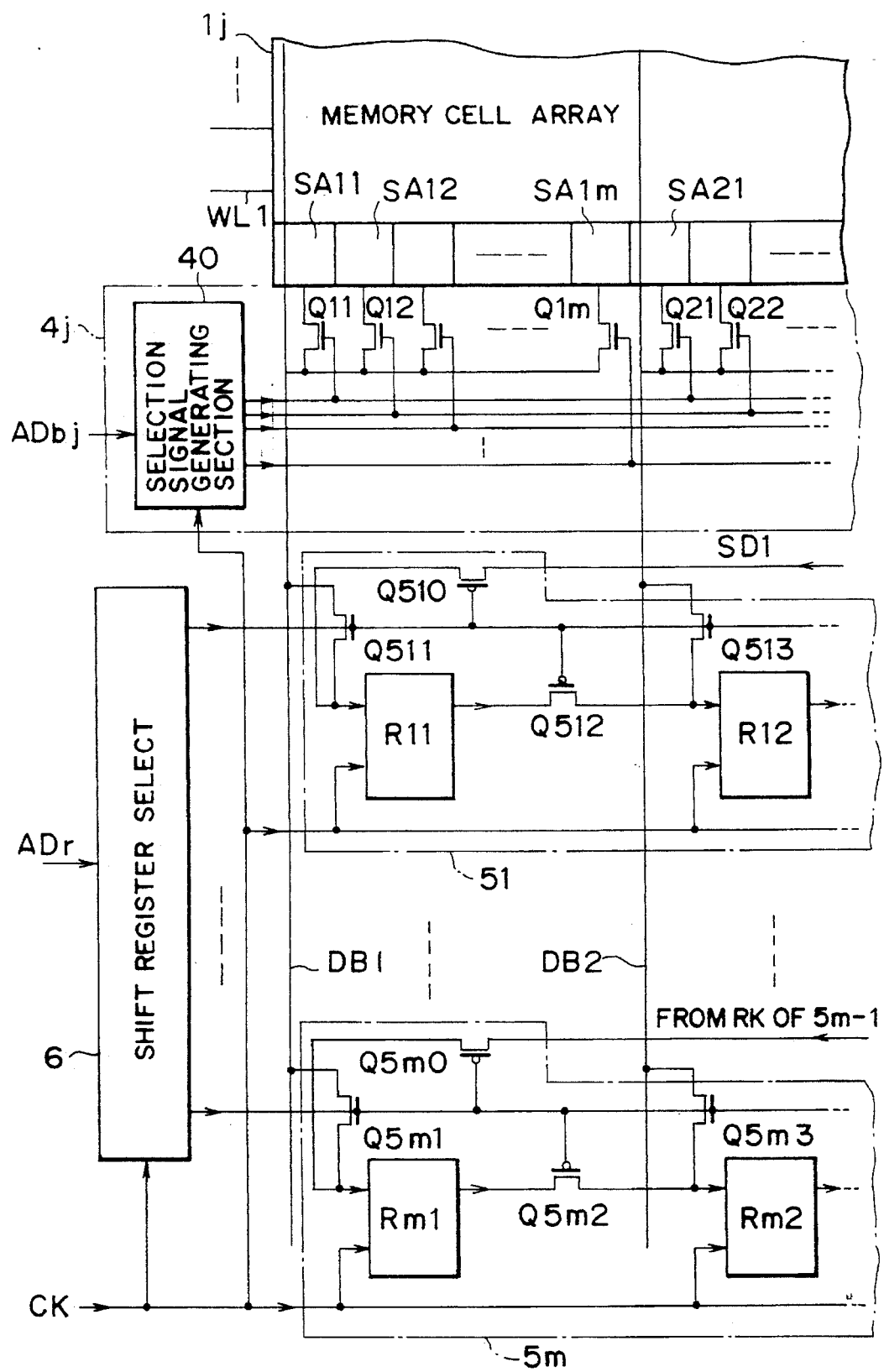
FIG. 4 is a circuit diagram showing in greater detail a circuit portion of the dual port memory shown in FIG. 3.

FIG. 4 is a circuit diagram showing in greater detail a circuit portion of the dual port memory shown in FIG. 3. With reference to FIG. 4, it will be demonstrated how much the number of circuit elements is reduced by the embodiment.

An example will be considered in which each word is composed of 512 bits and the memory cell array section is divided into Four memory cell arrays, similar to the case previously discussed in relation to the conventional dual port memory. In this case, the number of transistors required for the bit line selecting circuits 41-4n is 512×4, the number of transistors required for the shift register circuit, i.e., for all the partial shift registers 51-5m is 2×512, and the number off registers required for the shift register circuit is 512. Namely, the total number of transistors is reduced to 512×6 which is ¾ that of the conventional dual port memory, and the total number of registers is reduced to 512 which is one-eighth that of the conventional dual port memory.

Next, the number of registers will be estimated at the number of the transistors which form the registers for making a comparison in terms of the number of the transistors between the dual port memory of the present embodiment and the conventional one.

Since a simple register can be formed of four transistors, the total number of transistors used in the present embodiment is (512×6)+(512×4)=512×10. On the other hand, the number of transistors used in the conventional dual port memory is (512×8)+(512×8×4)=512×40. Namely, in the dual port memory according to the present embodiment, the number of transistors can be reduced almost to one-fourth of that in the conventional dual port memory. Although, in the present embodiment, the selection signal generating section 40 and the shift register selection control circuit 6 are additionally provided to the memory, the number of transistors provided for these circuits is substantially negligible as compared to the reduced number of the transistors in the present embodiment.

The above estimate is based on the premise that the shift register circuit includes a proper number of registers for storing all the data for each word. The total number of transistors, however, can be further reduced if the number of partial shift registers is reduced to the minimum number, which is 2.

Figure 5:
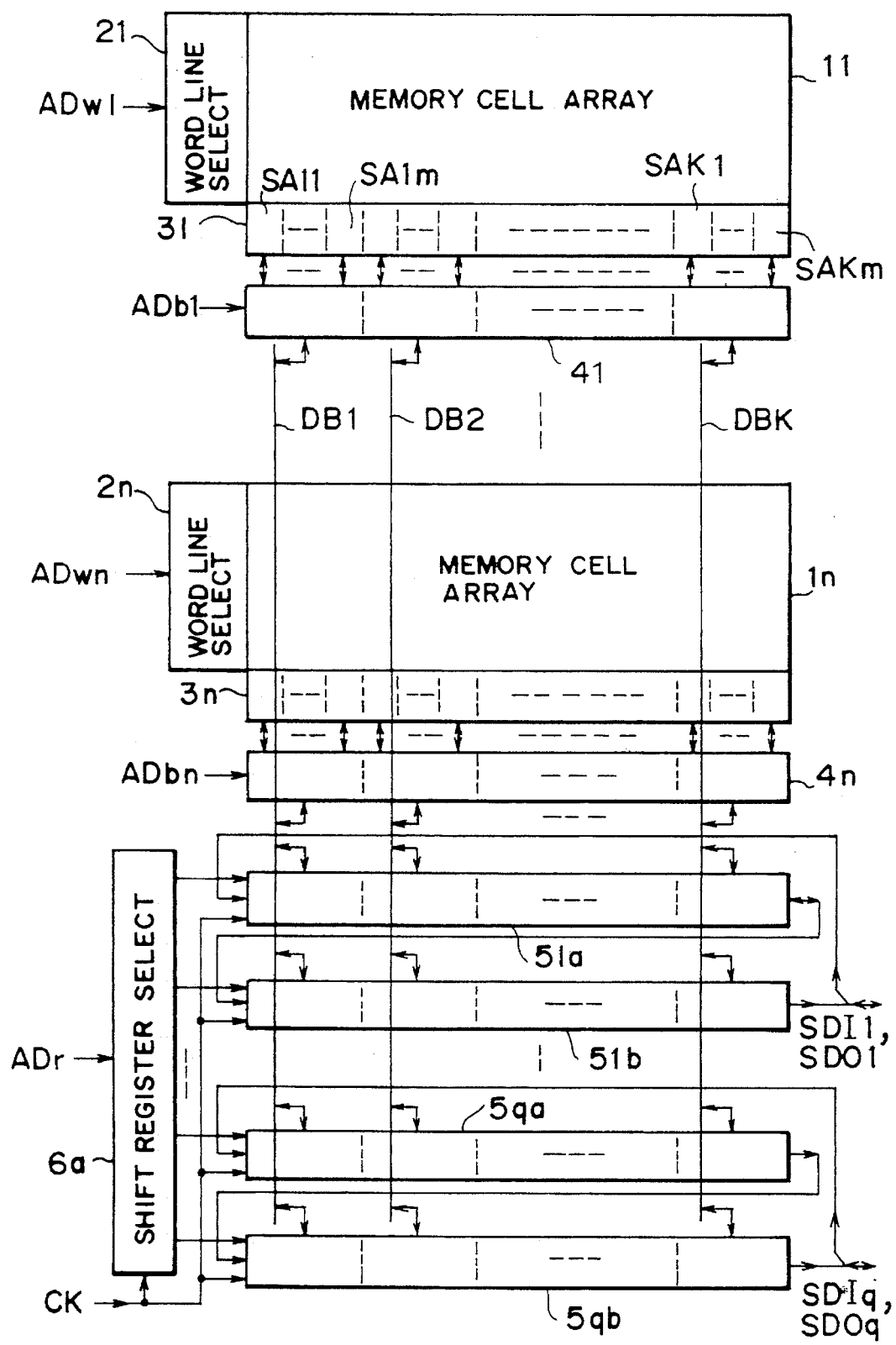
FIG. 5 is a block diagram showing a dual port memory according to a second embodiment of the present invention.

FIG. 5 is a block diagram showing a dual port memory according to a second embodiment of the present invention. The second embodiment demonstrates the case where the present invention is applied to a dual port memory which has q serial access ports (q is an integer not less than 2). In this embodiment, the minimum number, i.e., two of partial shift registers (51a and 51b, for example) are provided for each of the serial access ports. Circuit elements in FIG. 4 which are the same as those shown in FIG. 3 are denoted by the same reference symbols as those in FIG. 3. Since the rest of the structure is similar to that of the first embodiment, Further description of the construction thereof is not made here for avoiding a duplication.

In the second embodiment, when a first set of partial shift registers 51a and 51b connected to a first serial access port is filled with a first data portion of one-word data supplied from the first serial port, a second data portion of the one-word data is input from a second serial access port to the second set of partial shift registers, for example 52a and 52b while the first data portion is transferred from the first set of the partial shift registers 51a and 51b to the memory array section. Accordingly, the amount of time required for data transfer can be further reduced as compared to that of the first embodiment.

Since above embodiments are described only for examples, the present invention is not limited to such embodiments and it will be obvious for those skilled in the art that various modifications or alterations can be easily made based on the above embodiments within the scope of the present invention.

What is claimed is:

1. A dual port memory comprising:

n memory cell arrays each having a plurality of word lines, a plurality of bit lines intersecting said plurality of word lines while insulated therefrom, and a plurality of memory cells, disposed correspondingly to intersections between said bit lines and said word lines, each for outputting data stored therein to corresponding one of said bit lines and for receiving data therefrom, said plurality of bit lines divided into k bit line groups, each of said k bit line groups including m bit lines;

k data buses each operatively connected to each of said k bit line groups of each of said n memory cell arrays;

n bit selecting circuits, disposed correspondingly to said n memory cell arrays, for selecting one of said m bit lines in each of said k bit line groups of said corresponding memory cell array in accordance with bit selection signals thereby effecting data transfer between said one of said m bit lines and said k data buses;

at least one serial access port;

and a shift register circuit connected to said serial access port, wherein said shift register circuit has p serially connected partial shift registers each including k serially connected individual registers operatively connected to each of said k data buses, respectively, said partial shift registers operating for receiving serial bit data from outside through said serial access port and storing said serial data in said individual registers or for transferring serial data stored in said partial shift registers through said k data buses to said one of said n memory cell arrays;

wherein each of said n, k, m and p is an integer not less than two.

2. A dual port memory as defined in claim 1 wherein m is equal to p.

3. A dual port memory as defined in claim 1 wherein said at least one serial access port include q serial access ports, said q being an integer not less than two, and wherein said p serially connected partial shift registers include q groups of k said individual registers, each of said q groups of said individual registers being connected to one of said q serial access ports.

4. A dual port memory comprising:

a plurality of memory cell arrays including a plurality of memory cells;

a plurality of bit selecting circuits for selectively accessing said memory cells, each electrically connected to one of said memory cell arrays, respectively, and divided into a plurality of bit line groups;

a plurality of data buses each associated with one of said plurality of bit line groups and electrically connected to said plurality of bit selecting circuits;

a single shift register circuit electrically connected to said plurality of data buses and divided into a plurality of partial shift registers connected in series; and at least one serial access port electrically connected to said single shift register circuit.

5. A dual port memory device comprising:

a plurality of memory cell arrays including a plurality of memory cells;

a plurality of bit selecting circuits for selectively accessing said memory cells, each electrically connected to one of said memory cell arrays, respectively, and divided into a plurality of bit selecting groups;

a plurality of data buses each associated with one of said plurality of bit line groups and electrically connected to said plurality of bit selecting circuits;

a single shift register circuit electrically connected to said plurality of data buses and divided into a plurality of partial shift registers connected in series; and at least one serial access port electrically connected to said single shift register circuit;

wherein each of said bit selecting groups comprises a plurality of bit lines, each bit line being connected to a plurality of memory cells, and wherein said bit selecting circuit can simultaneously select one bit line in each of said bit selecting groups.

6. A dual port memory device comprising:

a plurality of memory cell arrays including a plurality of memory cells;

a plurality of bit selecting circuits for selectively accessing said memory cells, each electrically connected to one of said memory cell arrays, respectively, and divided into a plurality of bit selecting groups;

a plurality of data buses each associated with one of said plurality of bit line groups and electrically connected to said plurality of bit selecting circuits;

a single shift register circuit electrically connected to said plurality of data buses and divided into a plurality of partial shift registers connected in series; and at least one serial access port electrically connected to said single shift register circuit;

wherein said plurality of partial shift registers comprises a plurality of individual registers connected in series, each one of said individual registers being connected to one of said plurality of data buses.

7. A dual port memory device comprising:

a plurality of memory cell arrays including a plurality of memory cells;

a plurality of bit selecting circuits for selectively accessing said memory cells, each electrically connected to one of said memory cell arrays, respectively, and divided into a plurality of bit selecting groups;

a plurality of data buses each associated with one of said plurality of bit line groups and electrically connected to said plurality of bit selecting circuits;

a single shift register circuit electrically connected to said plurality of data buses and divided into a plurality of partial shift registers connected in series;

at least one serial access port electrically connected to said single shift register circuit; and a shift register select circuit electrically connected to said single shift register, to select one of said plurality of partial shift registers.

* * * * *